US011350050B2

(12) United States Patent
Kimizuka

(10) Patent No.: US 11,350,050 B2
(45) Date of Patent: May 31, 2022

(54) SEMICONDUCTOR INTEGRATED CIRCUIT AND IMAGING DEVICE

(71) Applicant: SONY SEMICONDUCTOR SOLUTIONS CORPORATION, Kanagawa (JP)

(72) Inventor: Naohiko Kimizuka, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 84 days.

(21) Appl. No.: 16/761,464

(22) PCT Filed: Sep. 25, 2018

(86) PCT No.: PCT/JP2018/035401
§ 371 (c)(1),
(2) Date: May 4, 2020

(87) PCT Pub. No.: WO2019/092999
PCT Pub. Date: May 16, 2019

(65) Prior Publication Data
US 2020/0396408 A1 Dec. 17, 2020

(30) Foreign Application Priority Data
Nov. 13, 2017 (JP) .............................. JP2017-217865

(51) Int. Cl.
H04N 5/374 (2011.01)
H01L 27/146 (2006.01)
(Continued)

(52) U.S. Cl.
CPC ... H04N 5/37452 (2013.01); H01L 27/14612 (2013.01); H01L 27/14643 (2013.01); H01L 29/739 (2013.01)

(58) Field of Classification Search
CPC .......... H04N 5/37452; H01L 27/14612; H01L 27/14643; H01L 29/739
See application file for complete search history.

(56) References Cited

U.S. PATENT DOCUMENTS

2007/0152752 A1* 7/2007 Oishi .................. H03F 3/45183
330/252
2013/0075830 A1 3/2013 Miyano et al.
(Continued)

FOREIGN PATENT DOCUMENTS

| JP | 2013-069977 A | 4/2013 |
|---|---|---|
| WO | 2016/042876 A1 | 3/2016 |
| WO | 2016/136448 A1 | 9/2016 |

OTHER PUBLICATIONS

Kim, et al., "A Steep-Slope Tunnel FET Based SAR Analog-to-Digital Converter", IEEE Transactions on Electron Devices, vol. 61, No. 11, Nov. 2014, pp. 3661-3667.
(Continued)

Primary Examiner — Abdelaaziz Tissire
(74) Attorney, Agent, or Firm — Chip Law Group

(57) ABSTRACT

In a solid-state imaging element provided with a differential pair of transistors, noise of a signal from the differential pair is reduced. The semiconductor integrated circuit includes a pixel circuit and a pair of TFETs (Tunnel Field Effect Transistors). In the semiconductor integrated circuit, the pixel circuit photoelectrically converts incident light to generate a pixel signal. Further, in the semiconductor integrated circuit, the pair of TFETs amplifies the difference between the pixel signal generated by the pixel circuit and a predetermined reference signal that changes with time, and outputs the amplified difference as a differential amplification signal.

7 Claims, 16 Drawing Sheets

(51) Int. Cl.
  *H01L 29/73*  (2006.01)
  *H04N 5/3745*  (2011.01)
  *H01L 29/739*  (2006.01)

(56) References Cited

U.S. PATENT DOCUMENTS

2015/0333534 A1* 11/2015 Liu ................... H01L 29/7391
                     307/104
2016/0182842 A1* 6/2016 Mabuchi ................ H03M 1/56
                     348/308

OTHER PUBLICATIONS

Sedighi, et al., "Analog Circuit Design Using Tunnel-FETs, IEEE Transactions on Circuits and Systems I: Regular Papers", vol. 62, No. 1, Jan. 2015, pp. 39-48.

Martino, et al., "Analysis of TFET and FinFET differential pairs with active load from 300K to 450K", Joint International EUROSOI Workshop and International Conference on Ultimate Integration on Silicon (EUROSOI-ULIS), IEEE, Mar. 24, 2016, pp. 246-249.

International Search Report and Written Opinion of PCT Application No. PCT/JP2018/035401, dated Dec. 18, 2018, 10 pages of ISRWO.

Martino, et al., "Analysis of TFET and FinFET differential pairs with active load from 300K to 450K", Joint International EUROSOI Workshop and International Conference on Ultimate Integration on Silicon (EUROSOI-ULIS), Jan. 25-27, 2016, 4 pages.

* cited by examiner

F I G. 1
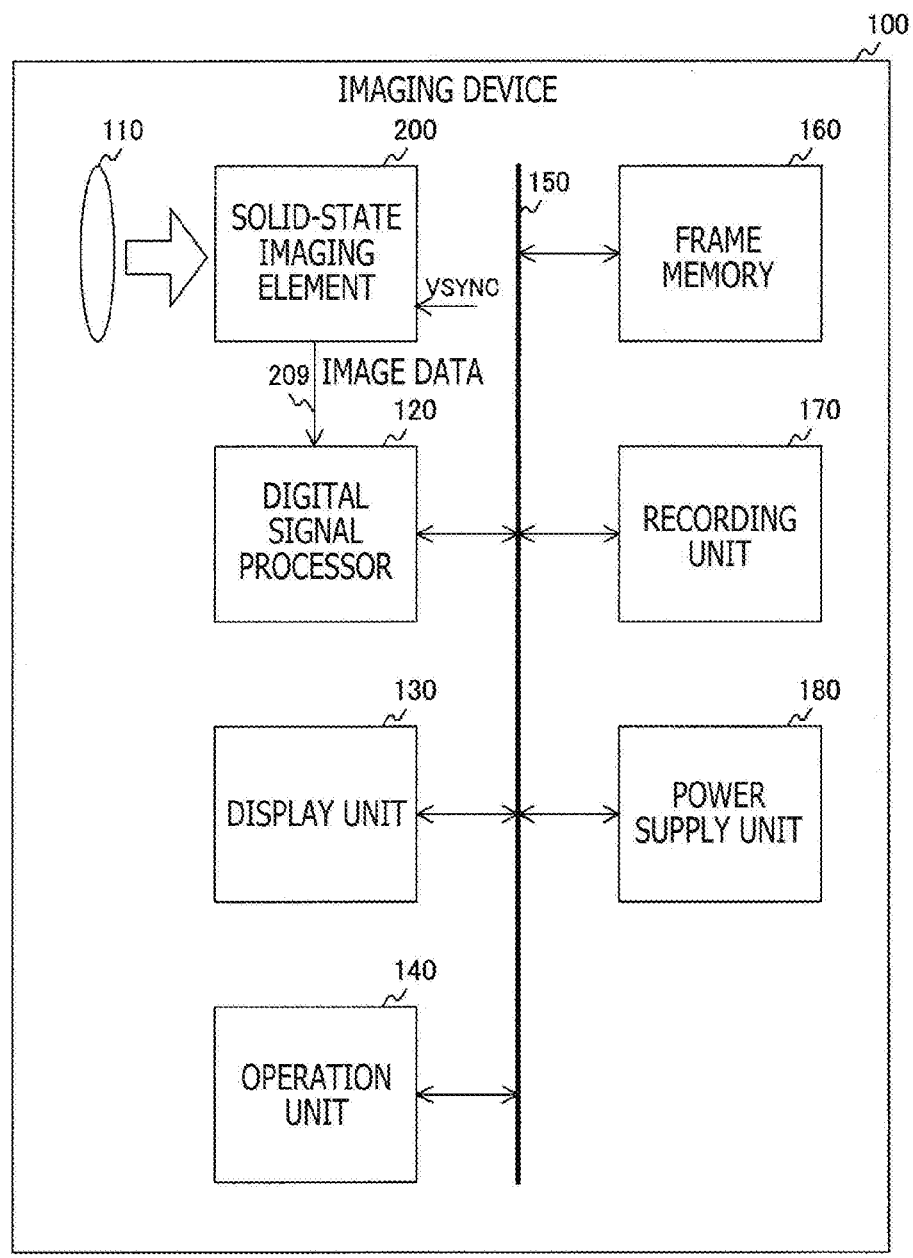

SEMICONDUCTOR INTEGRATED CIRCUIT AND IMAGING DEVICE

CROSS REFERENCE TO RELATED APPLICATIONS

This application is a U.S. National Phase of International Patent Application No. PCT/JP2018/035401 filed on Sep. 25, 2018, which claims priority benefit of Japanese Patent Application No. JP 2017-217865 filed in the Japan Patent Office on Nov. 13, 2017. Each of the above-referenced applications is hereby incorporated herein by reference in its entirety.

TECHNICAL FIELD

The present technology relates to a semiconductor integrated circuit and an imaging device. To be specific, the present invention relates to a semiconductor integrated circuit and an imaging device each provided with a comparator for comparing a pixel signal with a reference signal.

BACKGROUND ART

Conventionally, an ADC (Analog to Digital Converter) has been used to convert an analog pixel signal into a digital signal in an imaging device or the like. For example, an imaging device in which an ADC is arranged for each pixel has been proposed (for example, see PTL 1). In this imaging device, each ADC is provided with a comparator for comparing an analog pixel signal with a reference signal. In the comparator, a pair of MOSFETs (Metal Oxide Semiconductor Field Effect Transistors) forming a differential pair is arranged.

CITATION LIST

Patent Literature

[PTL 1]
PCT Patent Publication No. WO2016/136448

SUMMARY

Technical Problem

In the above-described conventional art, since an ADC is arranged for each pixel, the reading speed of image data can be improved as compared with the case where an ADC is arranged for each column. However, in this conventional technique, it is difficult to reduce thermal noise of a signal from transistors (MOSFETs) of a differential pair. This thermal noise is a kind of noise generated by the irregular thermal oscillation of free electrons, and it is known that the thermal noise can be reduced by reducing the subthreshold coefficient of the transistor. Here, the subthreshold coefficient is a ratio between the logarithmic value of the drain current and the gate voltage. In the above-described conventional technology, a MOSFET is used for a differential pair, and in the MOSFET, a subthreshold coefficient has a theoretical lower limit. For this reason, thermal noise cannot be suppressed below a noise level corresponding to the lower limit, and there is a problem that it is difficult to reduce noise including the thermal noise component.

The present technology has been generated in view of such a situation, and has an object to reduce noise of a signal from a differential pair in a solid-state imaging element including transistors of the differential pair.

Solution to Problem

The present technology has been made to solve the above-described problem, and a first aspect of the present technology is a semiconductor integrated circuit including a pixel circuit that generates a pixel signal by photoelectrically converting incident light, and a pair of TFETs (Tunnel Field Effect Transistors) for amplifying the difference between the pixel signal and a predetermined reference signal that changes with time and outputting the amplified difference as a differential amplification signal. This brings about an effect of reducing thermal noise of pixel data.

Further, the first aspect further may include a MOSFET (Metal Oxide Semiconductor Field Effect Transistor) that supplies a constant current to the pair of TFETs, and the gate area of the MOSFET may be substantially equal to the gate area of each of the pair of TFETs. This brings about an effect of suppressing increase in the mounting area.

Furthermore, in the first aspect, a predetermined number of the pixel circuits may be arranged in a two-dimensional lattice shape, and the above pair of TFETs may be provided for each of the pixel circuits. This brings about an effect of generating a differential amplification signal for each pixel.

Still further, the first aspect may further include a data storage unit that acquires and stores data indicating time until the differential amplification signal changes to have a value different from an initial value, as pixel data. This brings about an effect of acquiring pixel data.

Still further, in the first aspect, the data storage unit may be provided for each of the pixel circuits. This provides an effect of converting an analog signal into a digital signal for each pixel circuit.

Moreover, in the first aspect, the storage unit may be provided for each column which is a set of the pixel circuits arranged in a predetermined direction. This has an effect of converting an analog signal into a digital signal for each column.

In addition, the first aspect may further include a substrate, an N-well layer formed on the substrate, a pair of N layers including an N-type semiconductor, and a P layer including a P-type semiconductor. A configuration may be made so that the P layer and the pair of N layers are provided on the N-well layer, the P layer is disposed between the pair of N layers on the N-well layer, each source of the pair of TFETs is formed in the P layer, and drains of the pair of TFETs are formed in the pair of N layers, respectively. This brings about the effect of forming a pair of TFETs sharing a source on the substrate.

Besides, a second aspect of the present technology is an imaging device including a pixel circuit that photoelectrically converts incident light to generate a pixel signal, a pair of TFETs (Tunnel Field Effect Transistors) for amplifying the difference between the pixel signal and a predetermined reference signal that changes with time and outputting the amplified difference as a differential amplification signal, a data storage unit that acquires and stores data indicating time until the differential amplification signal changes to have a value different from an initial value, as pixel data, and a processing unit that performs a predetermined processing on the pixel data. This brings about an effect of reducing noise of image data.

Advantageous Effects of Invention

According to the technique, in the solid-state imaging element provided with the transistors of a differential pair, the outstanding effect of reducing the noise of the signal from a differential pair can be brought about. Note that the effects are not necessarily limited to ones described here, and may be any of the effects described in the present disclosure.

BRIEF DESCRIPTION OF DRAWINGS

FIG. 1 is a block diagram depicting a configuration example of an imaging device according to a first embodiment of the present technology.

DESCRIPTION OF EMBODIMENTS

Figure 2:
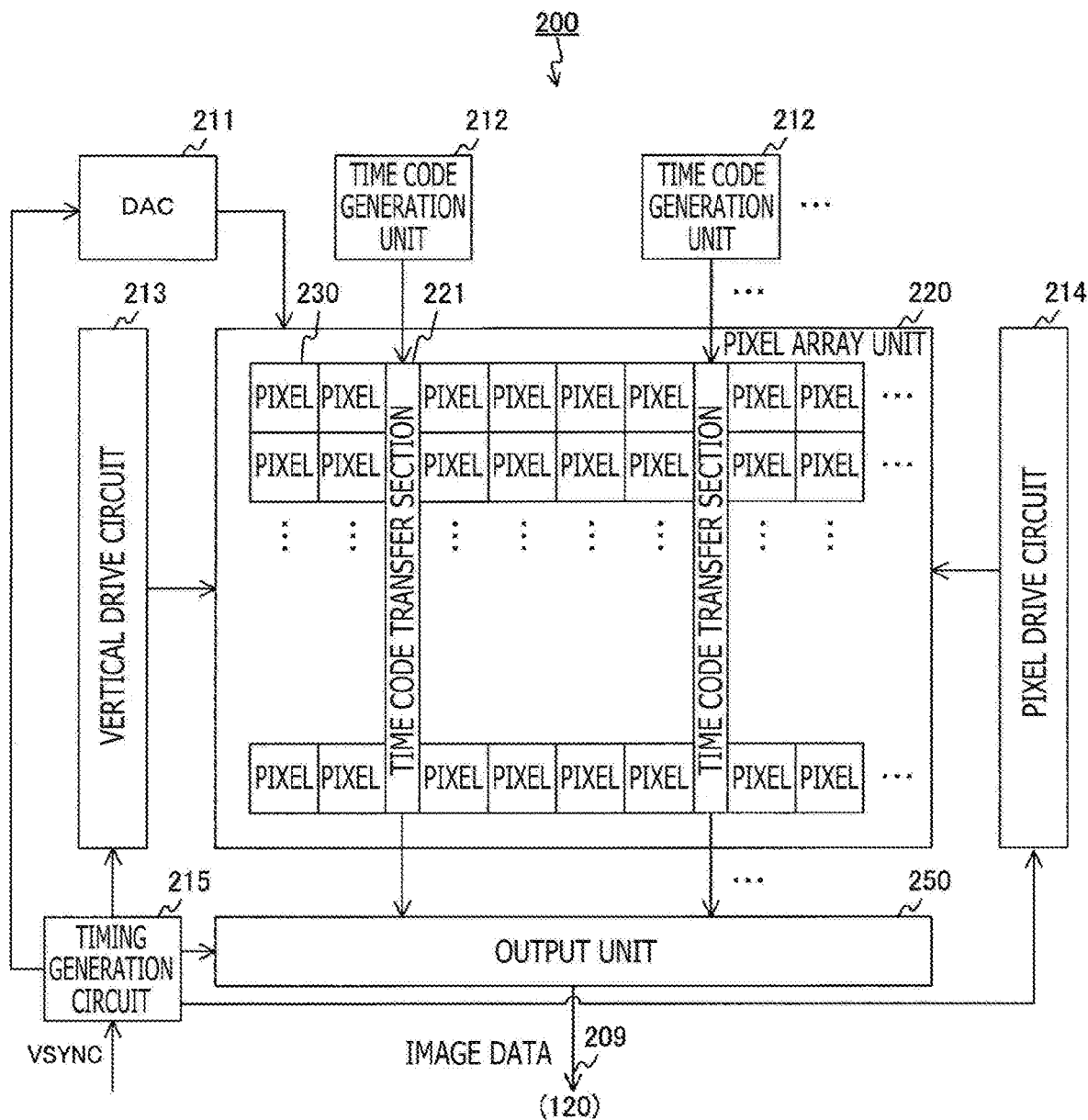
FIG. 2 is a block diagram depicting a configuration example of a solid-state imaging element according to the first embodiment of the present technology.

Hereinafter, modes for implementing the present technology (hereinafter, referred to as embodiments) will be described. The description will be made in the following order.

1. First Embodiment (An Example Using TFETs for A Differential Pair)

2. Second Embodiment (An Example in Which An ADC is Arranged for Each Column And TFETs are Used for A Differential Pair)

3. Example of Application to Mobile Bodies

1. First Embodiment

[Configuration Example of the Imaging Device]

FIG. 1 is a block diagram depicting a configuration example of an imaging device 100 according to an first embodiment of the present technology. The imaging device 100 is a device for capturing image data, and includes an optical unit 110, a solid-state imaging element 200, and a digital signal processor 120. Further, the imaging device 100 includes a display unit 130, an operation unit 140, a bus 150, a frame memory 160, a recording unit 170, and a power supply unit 180. As the imaging device 100, for example, in addition to a digital camera such as a digital still camera, a smartphone, a personal computer, an in-vehicle camera, or the like having an imaging function is assumed.

The optical unit 110 collects light from a subject and guides the light to the solid-state imaging element 200. The solid-state imaging element 200 generates image data in synchronization with the vertical synchronization signal VSYNC. Here, the vertical synchronization signal VSYNC is a periodic signal having a predetermined frequency (for example, 30 Hertz) indicating the timing of imaging. The solid-state imaging element 200 supplies the generated image data to the digital signal processor 120 via a signal line 209.

The digital signal processor 120 executes predetermined signal processing such as demosaic processing and noise reduction processing on image data from the solid-state imaging element 200. The digital signal processor 120 outputs the processed image data to the frame memory 160 or the like via the bus 150. Note that the digital signal processor is an example of a processing unit described in the claims.

The display unit 130 displays images with image data. As the display unit 130, for example, a liquid crystal panel or an organic EL (Electro Luminescence) panel is conceivable. The operation unit 140 generates an operation signal in accordance with a user operation.

The bus 150 is a common path through which the optical unit 110, the solid-state imaging element 200, the digital signal processor 120, the display unit 130, the operation unit 140, the frame memory 160, the recording unit 170, and the power supply unit 180 exchange data with each other.

The frame memory 160 holds image data. The recording unit 170 records various data such as image data. The power supply unit 180 supplies power to the solid-state imaging element 200, digital signal processor 120, display unit 130, and the like.

[Configuration Example of the Solid-State Imaging Element]

FIG. 2 is a block diagram depicting a configuration example of the solid-state imaging element according to the first embodiment of the present technology. The solid-state imaging element 200 includes a DAC (Digital to Analog Converter) 211 and a plurality of time code generation units 212. Further, the solid-state imaging element 200 includes a vertical drive circuit 213, a pixel array unit 220, a pixel drive circuit 214, a timing generation circuit 215, and an output unit 250.

Further, the pixel array unit 220 includes a plurality of time code transfer sections 221 and a plurality of pixels 230. The time code transfer section 221 is provided for each time code generation unit 212. In addition, the plurality of pixels 230 is arranged in a two-dimensional lattice shape.

Hereinafter, a set of pixels 230 arranged in a horizontal direction is referred to as a "row," and a set of pixels 230 arranged perpendicularly to the row is referred to as a "column."

The DAC 211 generates a reference signal that changes with time in a slope shape by DA (Digital to Analog) conversion. The DAC 211 supplies a reference signal to the pixel array unit 220.

The time code generation unit 212 generates a time code. The time code indicates time within a period in which the reference signal changes in a slope shape. The time code generation unit 212 supplies the generated time code to the pixel array unit 220.

The timing generation circuit 215 generates various timing signals in synchronization with the vertical synchronization signal VSYNC, and supplies the timing signals to the vertical drive circuit 213, the output unit 250, and the like.

The vertical drive circuit 213 performs control to output the pixel data generated in the pixel 230 to the output unit 250 in synchronization with the timing signal. The pixel drive circuit 214 drives the pixel 230.

The output unit 250 performs signal processing including CDS processing on the pixel data. The output unit 250 outputs the processed pixel data to the digital signal processor 120.

The time code transfer section 221 transfers the time code from the corresponding time code generation unit 212. The time code transfer section 221 transfers the time code from the corresponding time code generation unit 212 to the pixel 230, and transfers the pixel data from the pixel 230 to the output unit 250. The pixel 230 generates pixel data.

Figure 3:
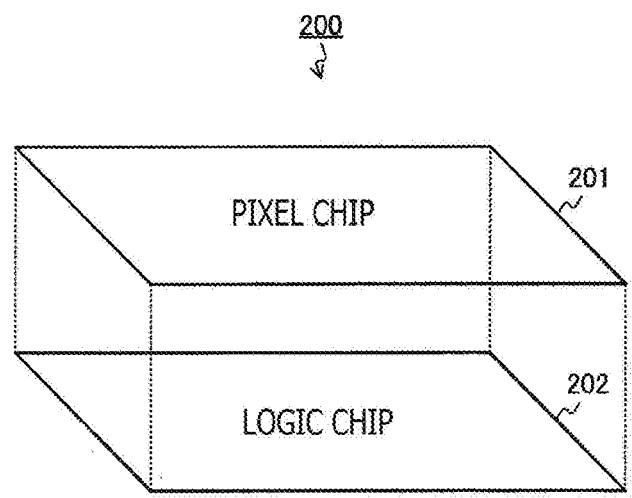
FIG. 3 is a diagram depicting an example of a stacked structure of the solid-state imaging element according to the first embodiment of the present technology.

FIG. 3 is a diagram depicting an example of a stacked structure of the solid-state imaging element 200 according to the first embodiment of the present technology. The solid-state imaging element 200 includes a pixel chip 201 and a logic chip 202. The pixel chip 201 is stacked above the logic chip 202, as the direction from the solid-state imaging element 200 toward the optical unit 110 is regarded as the upward direction. The circuits provided on each chip will be described later.

Figure 4:
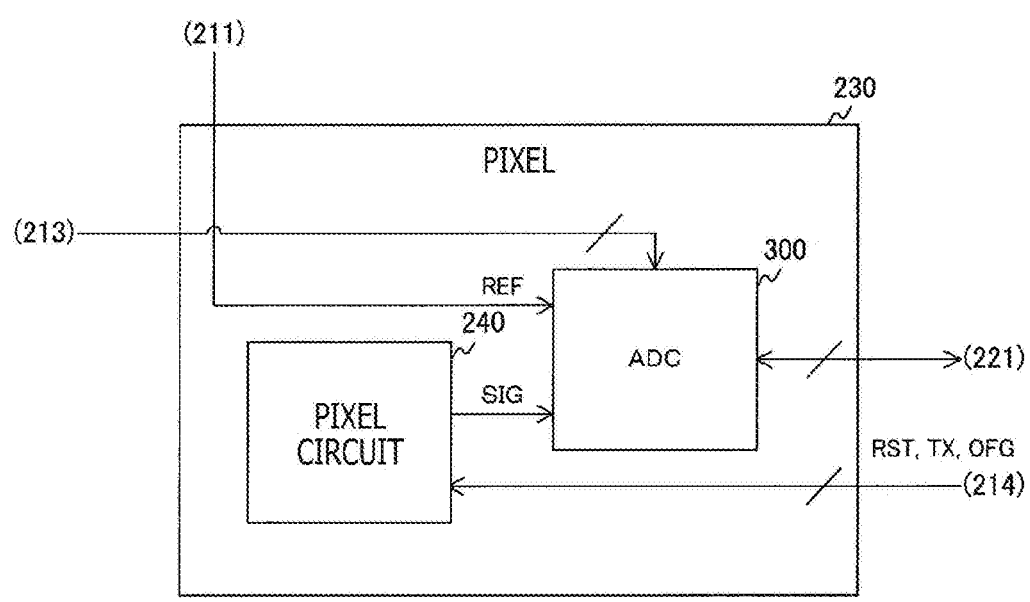
FIG. 4 is a block diagram depicting a configuration example of a pixel according to the first embodiment of the present technology.

FIG. 4 is a block diagram depicting a configuration example of the pixel 230 according to the first embodiment of the present technology. The pixel 230 includes a pixel circuit 240 and an ADC 300.

The pixel circuit 240 generates an analog signal corresponding to the amount of received light as a pixel signal SIG under the control of the pixel drive circuit 214. The pixel circuit 240 supplies the pixel signal SIG to the ADC 300.

The ADC 300 converts the pixel signal SIG into a digital signal under the control of the vertical drive circuit 213. The ADC 300 compares the reference signal REF from the DAC 211 with the pixel signal SIG, and generates a digital signal on the basis of the comparison result VCO. Then, the ADC 300 supplies the generated digital signal to the time code transfer section 221.

[Configuration Example of the ADC]

Figure 5:
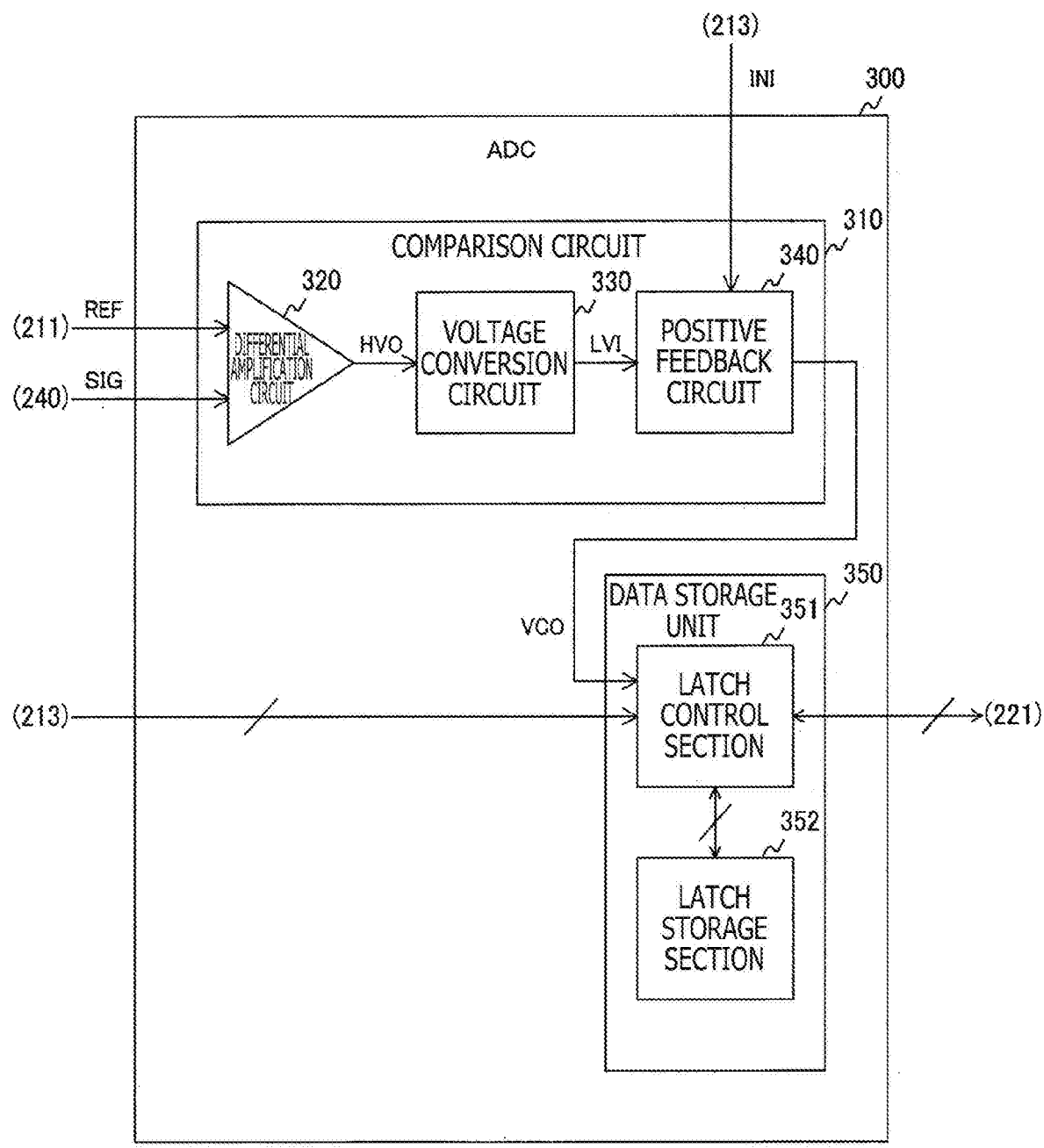
FIG. 5 is a block diagram depicting a configuration example of an ADC according to the first embodiment of the present technology.

FIG. 5 is a block diagram depicting a configuration example of the ADC 300 according to the first embodiment of the present technology. The ADC 300 includes a comparison circuit 310 and a data storage unit 350. The comparison circuit 310 includes a differential amplification circuit 320, a voltage conversion circuit 330, and a positive feedback circuit 340. The data storage unit 350 includes a latch control section 351 and a latch storage section 352.

The differential amplification circuit 320 amplifies the difference between the reference signal REF from the DAC 211 and the pixel signal SIG from the pixel circuit 240. The differential amplification circuit 320 outputs a signal obtained by amplifying the difference to the voltage conversion circuit 330 as a differential amplification signal HVO. The differential amplification signal HVO is at a high level when the pixel signal SIG is higher than the reference signal REF, for example. In the initial state, the level of the reference signal REF is minimum, and increases with time. For this reason, the initial value of the differential amplification signal HVO is at a high level, and then inverted to be at a low level at the timing when the reference signal REF becomes equal to or higher than the pixel signal SIG.

The voltage conversion circuit 330 converts the voltage of the differential amplification signal HVO into a low potential at which the positive feedback circuit 340 can operate, and supplies the signal to the positive feedback circuit 340 as a converted signal LVI.

The positive feedback circuit 340 outputs a comparison result VCO which is inverted when the reference signal REF becomes equal to or more than the pixel signal SIG to the data storage unit 350 on the basis of the conversion signal LVI. Further, the positive feedback circuit 340 is initialized by an initialization signal INI from the vertical drive circuit 213.

The latch control section 351 controls a readout operation and a writing operation of the latch storage section 352 in accordance with a control signal from the vertical drive circuit 213. The latch control section 351 causes the latch storage section 352 to store the time code from the time code transfer section 221 therein until the comparison result VCO is inverted. The time code is updated every unit time. Then, when the comparison result VCO is inverted, the latch control section 351 stops updating of the time code and holds the time code at that point in time. As a result, data (time code) indicating the time until the differential amplification signal HVO is inverted (that is, when the comparison result VCO is inverted) is obtained as pixel data and stored in the latch storage section 352. This pixel data represents the amount of light received by the pixel 230.

Further, after the sweep of the reference signal REF is completed, the readout operation of the pixel data (time code) is started. The latch control section 351 causes the latch storage section 352 to output pixel data at the readout timing of the pixel 230. The time code transfer section 221 transfers the output pixel data to the output unit 250.

Figure 6:
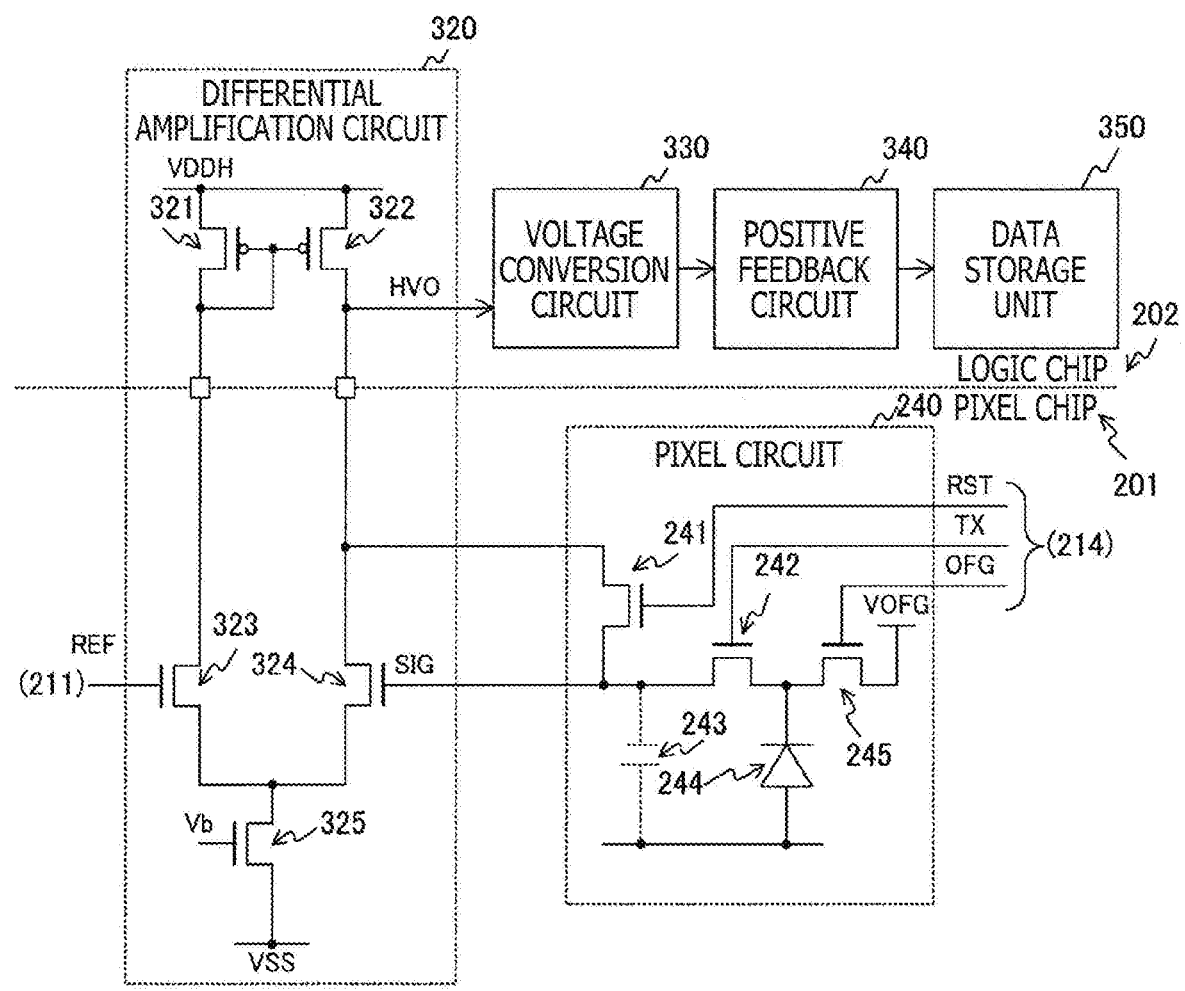
FIG. 6 is a circuit diagram depicting a configuration example of a pixel circuit and a differential amplification circuit according to the first embodiment of the present technology.

FIG. 6 is a circuit diagram depicting a configuration example of the pixel circuit 240 and the differential amplification circuit 320 according to the first embodiment of the present technology. The pixel circuit 240 includes a reset transistor 241, a transfer transistor 242, a floating diffusion layer 243, a photodiode 244, and a discharge transistor 245. For example, an nMOS transistor is used as the reset transistor 241, the transfer transistor 242, the photodiode 244, and the discharge transistor 245. Note that the circuit including the differential amplification circuit 230 and the pixel circuit 240 is an example of the semiconductor integrated circuit described in the claims.

The photodiode 244 generates electric charge by photoelectrically converting incident light. The discharge transistor 245 discharges the charge of the photodiode 244 in accordance with a discharge control signal OFG from the pixel drive circuit 214.

The transfer transistor 242 transfers charge from the photodiode 244 to the floating diffusion layer 243 in accordance with a transfer signal TX from the pixel drive circuit 214.

The floating diffusion layer 243 accumulates the transferred charge and generates a voltage corresponding to the amount of the accumulated charge. This voltage signal is output to the differential amplification circuit 320 as a pixel signal SIG.

The reset transistor 241 initializes the charge amount of the floating diffusion layer 243 in accordance with a reset signal RST from the pixel drive circuit 214.

Further, the differential amplification circuit 320 includes MOSFETs 321, 322, and 325, and TFETs 323 and 324. As the MOSFETs 321 and 322, P-type transistors are used, for example. Further, as the TFETs 323 and 324 and the MOSFET 325, N-type transistors are used, for example.

The MOSFETs 321 and 322 constitute a current mirror circuit. The power supply voltage VDDH is applied to the sources of the MOSFETs 321 and 322. The drain of the MOSFET 321 is connected to both of the gates of the MOSFETs 321 and 322. The drain of the MOSFET 322 is connected to the voltage conversion circuit 330.

The TFETs 323 and 324 form a differential pair, and the sources of these transistors are both connected to the drain of the MOSFET 325. The drain of the TFET 323 is connected to the drain of the MOSFET 321, and the drain of the TFET 324 is connected to the drain of the MOSFET 322. In addition, the reference signal REF from the DAC 211 is input to the gate of the TFET 323, and the pixel signal SIG from the pixel circuit 240 is input to the gate of the TFET 324. A signal obtained by amplifying the difference between the reference signal REF and the pixel signal SIG input to the TFETs 323 and 324 of the differential pair is output to the voltage conversion circuit 330 as a differential amplification signal HVO.

A predetermined bias voltage Vb is applied to the gate of the MOSFET 325, and a predetermined reference potential VSS is applied to the source. The MOSFET 325 functions as a constant current source that supplies a constant current according to the bias voltage Vb. This constant current is set to 1 to 100 nanoamperes (nA), for example. Generally, it is necessary to increase the value of the constant current in order to reduce random noise, and thus there is a fear that power consumption may increase.

Furthermore, the pixel circuit 240, the TFETs 323 and 324, and the MOSFET 325 are arranged on the pixel chip 201. On the other hand, the MOSFETs 321 and 322, and the voltage conversion circuit 330, the positive feedback circuit 340, the data storage unit 350, and the like at the subsequent stage are arranged on the logic chip 202. Note that the arrangement of circuits onto the pixel chip 201 and the logic chip 202 is not limited to the configuration depicted in FIG. 6.

Figure 7:
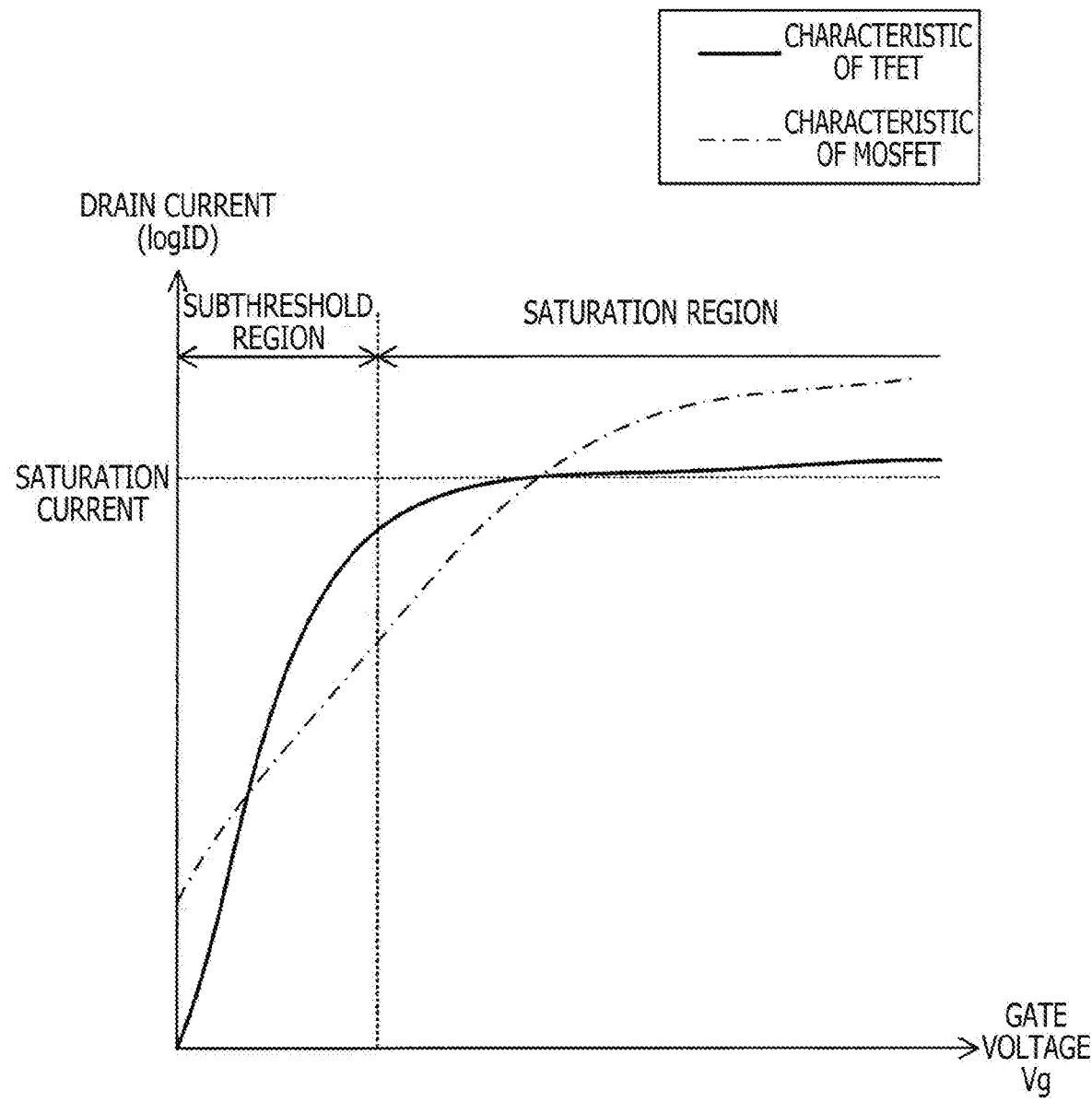
FIG. 7 is a graph depicting an example of current-voltage characteristics of a TFET (Tunnel Field Effect Transistor) and a MOSFET according to the first embodiment of the present technology.

FIG. 7 is a graph depicting an example of current-voltage characteristics of the TFET and the MOSFET according to the first embodiment of the present technology. The dashed-dotted line indicates the characteristic of the MOSFET (such as the MOSFET 321), and the solid line indicates the characteristic of the TFET (such as the TFET 323). The vertical axis in the figure represents the logarithmic value of the drain current, and the horizontal axis represents the gate voltage. Here, the subthreshold coefficient S is represented by the following equation.

$$S = dV_g/d(\log_{10} I_d)$$  Equation 1

In the above equation, $V_g$ denotes the gate voltage, and the unit is volt (V), for example. $I_d$ denotes the drain current, and the unit is ampere (A), for example.

In the subthreshold region until the drain current is saturated, the inclination of the curve of the TFET is larger than that of the MOSFET. Therefore, according to Equation 1, the subthreshold coefficient S of the TFET is smaller than the subthreshold coefficient of the MOSFET. For example, the subthreshold coefficient S of a MOSFET is 70 millivolts per digit (mV/dec), whereas the subthreshold coefficient of a TFET is approximately 52 millivolts (mV/dec).

The output noise current $S_{Id}$ in the subthreshold region is represented by the following equation.

$$S_{Id} = 2qI_d$$  Equation 2

In the above equation, q denotes the elementary electric charge. In addition, Equation 2 is described in "G. REIMBOLD, et al., White Noise of MOS Transistors Operating in Weak Inversion, IEEE TRANSACTIONS ON ELECTRON DEVICES 1982."

Next, the input noise voltage $S_{vg}$ is expressed by the following equation.

$$S_{Vg} = S_{Id}/gm^2$$  Equation 3

The symbol gm in the above equation denotes the transconductance, and the unit is siemens (S), for example.

By substituting Equation 2 into Equation 3, the following equation is obtained.

$$S_{Vg} = (2qI_d)/gm^2$$  Equation 4

By transforming Equation 1, the following equation is obtained.

[Math. 1]

$$S \equiv \frac{\partial V_g}{\partial (\log_{10} I_d)} = \frac{\partial V_g}{\partial I_d} \cdot \frac{\partial I_d}{\partial (\log_{10} I_d)} = \frac{1}{gm}\left(\frac{\partial}{\partial I_d}\log_{10} I_d\right)^{-1} = \frac{1}{gm}\left(\frac{1}{\ln 10 \cdot I_d}\right)^{-1} = \frac{I_d}{gm} \cdot \ln 10$$  Equation 5

From Equations 4 and 5, the following equation is obtained.

$$S_{Vg} = (2q/I_d) \cdot (S/\text{Log } 10)^2$$

From the above equation, as the subthreshold coefficient S becomes smaller, the input noise voltage $S_{Vg}$ corresponding to the thermal noise becomes smaller. Then, as described above, the subthreshold coefficient S of the TFET is smaller than the subthreshold coefficient of the MOSFET. Therefore, it can be seen that in the case of using the TFET for the differential pair, the thermal noise of the differential amplification signal HVO is smaller than in the case of using the MOSFET for the differential pair.

As described above, by using TFETs for a differential pair, thermal noise can be suppressed, and random noise including the thermal noise component can be reduced. For this reason, the necessity of increasing the constant current for the purpose of reducing random noise becomes smaller, and the value of the constant current when reducing the random noise to less than the allowable value is smaller than in the case of using the MOSFETs for the differential pair. Thereby, power consumption of the solid-state imaging element 200 can be reduced.

However, as is clear from the figure, since the saturation current of the TFET is smaller than that of the MOSFET, there is a fear that the operation speed of the logic circuit using the TFET may be lower than that of the case of using the MOSFET. However, since the differential amplification circuit 320 is not a logic circuit, there is no problem even if the saturation current is small.

Figure 8:
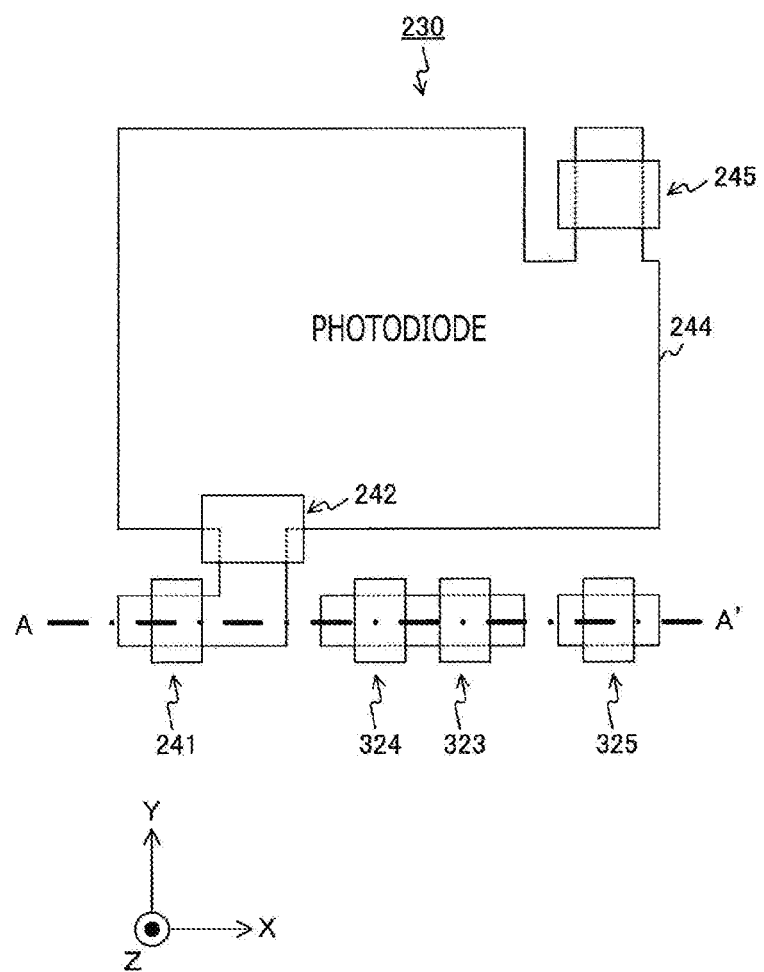
FIG. 8 is a diagram depicting an example of an arrangement layout of elements in a pixel according to the first embodiment of the present technology.

FIG. 8 is a diagram depicting an example of an arrangement layout of elements in the pixel 230 according to the first embodiment of the present technology. Hereinafter, a predetermined direction parallel to the light receiving surface is defined as an X direction, a direction perpendicular to the light receiving surface is defined as a Z direction, and a direction perpendicular to the X direction and the Z direction is defined as a Y direction.

The discharge transistor 245 and the transfer transistor 242 are connected to the photodiode 244. Further, the reset transistor 241, the TFET 323, the TFET 324, and the MOSFET 325 are arranged in the X direction.

Figure 9:
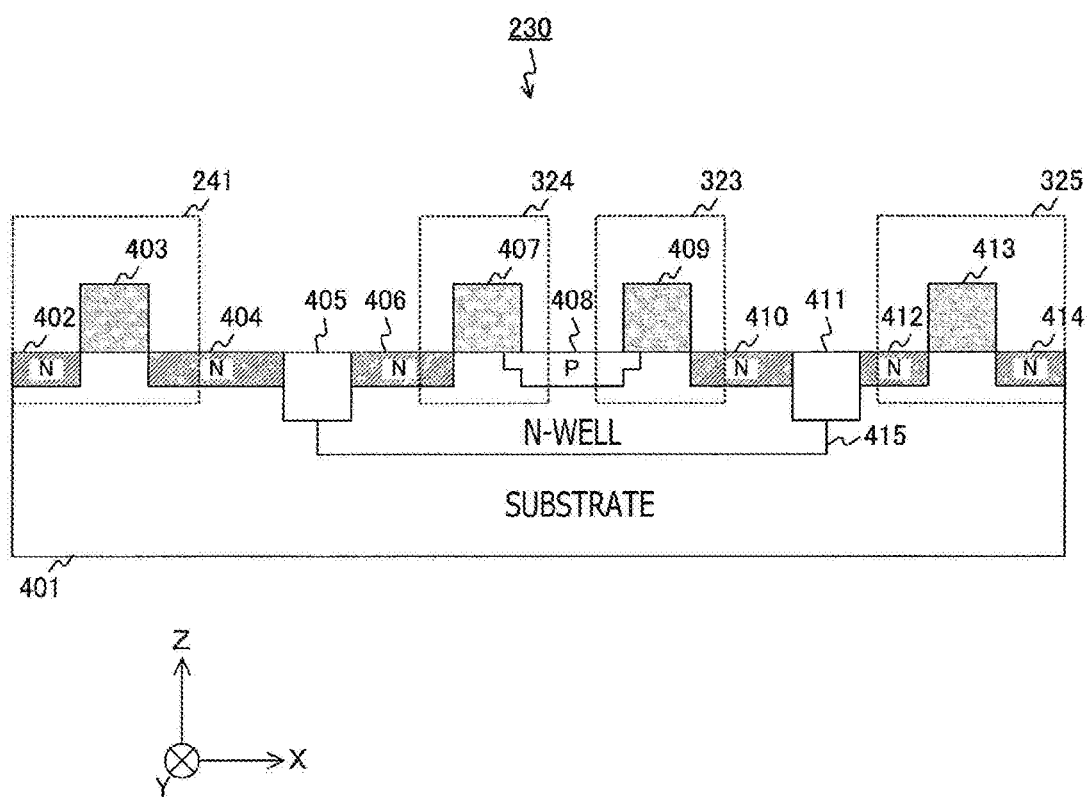
FIG. 9 is an example of a cross-sectional view of a pixel according to the first embodiment of the present technology.

FIG. 9 is an example of a cross-sectional view of the pixel 230 according to the first embodiment of the present technology. This figure is a cross-sectional view in the case of cutting the pixel 230 along the A-A' axis in FIG. 8.

N layers 402, 404, 412 and 414 including N-type semiconductors are formed on a substrate 401. A gate 403 is formed between the N layers 402 and 404, and a gate 413 is formed between the N layers 412 and 424. A source and a drain are formed in the N layers 402 and 404, and the source, the drain, and the gate 403 form the reset transistor 241. In addition, a source and a drain are formed also in the N layers 412 and 414, and the source, the drain, and the gate 413 form the MOSFET 325.

Further, an N-well layer 415 having a higher n-type impurity concentration than the substrate 401 is formed on the substrate 401, and N layers 406 and 410 and a P layer 408 including a P-type semiconductor are formed on the N-well layer 415. The P layer 408 is formed by photolithography and ion implantation. An inter-element isolation region 405 is provided between the N layers 404 and 406. An inter-element isolation region 411 is also provided between the N layers 410 and 412. A gate 407 is formed between the N layer 406 and the P layer 408, and a gate 409 is formed between the P layer 408 and the N layer 410. A part of the P layer 408 enters the lower portions of these gates, and the part is shallower than other parts and is called an extension.

A drain and a source are formed in the N layer 406 and the P layer 408, and the drain, the source, and the gate 407 form the TFET 324. Further, a drain and a source are formed in the N layer 410 and the P layer 408, and the drain, the source, and the gate 409 form the TFET 323. In addition, the gate oxide films of the TFETs 323 and 324 are set to have a thickness of 3.0 to 6.0 nanometers (nm), for example, and are formed simultaneously with the gate oxide films of peripheral transistors (such as the MOSFET 325).

Still further, the gate area of each of the TFETs 323 and 324 is set to be substantially equal to the gate area of a peripheral transistor such as the MOSFET 325. In a CMOS (Complementary MOS) image sensor of a conventional type (column ADC), a pixel cell having a relatively large area may be used, for example, in the case where priority is given to sensitivity over resolution. In this case, an amplifier transistor with a gate having a large area may be used as a pixel transistor to reduce 1/f noise in some cases, and thermal noise dominates random noise. In the case where the amplifier transistor is operated in the subthreshold region, the noise can be further reduced by applying a TFET to suppress the thermal noise in accordance with the present proposition.

Figure 10:
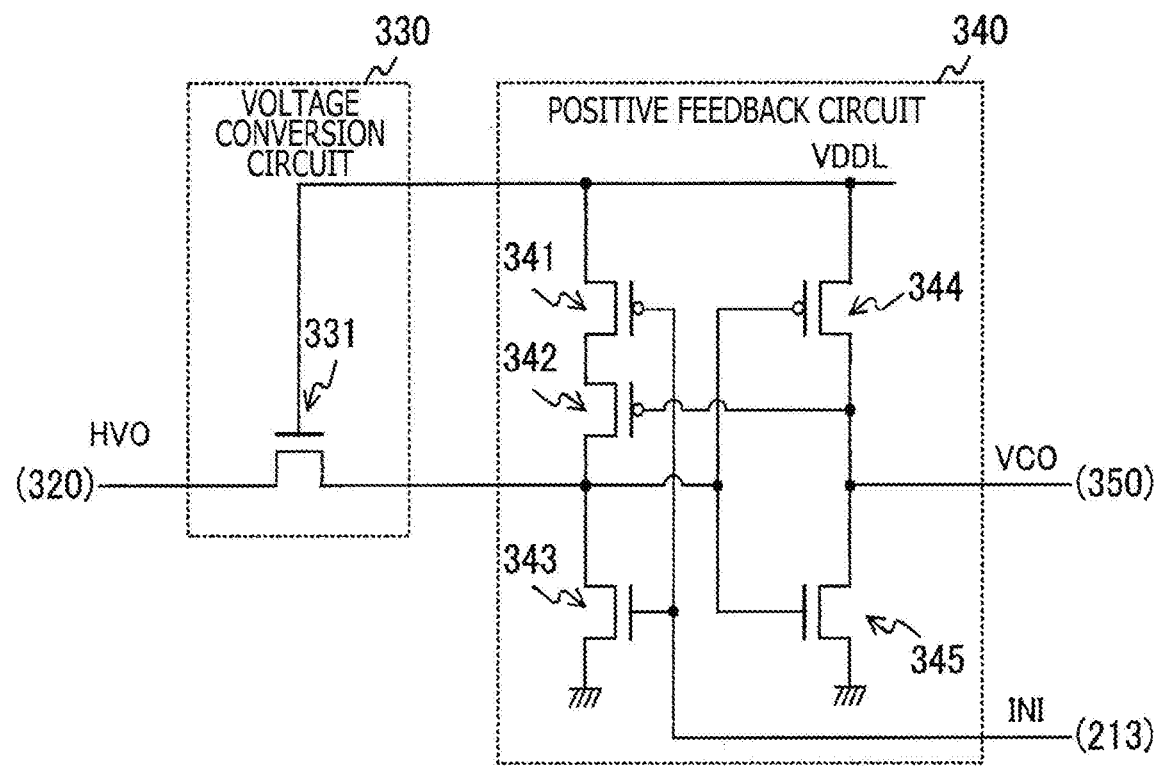
FIG. 10 is a circuit diagram depicting a configuration example of a voltage conversion circuit and a positive feedback circuit according to the first embodiment of the present technology.

FIG. 10 is a circuit diagram depicting a configuration example of the voltage conversion circuit 330 and the positive feedback circuit 340 according to the first embodiment of the present technology.

The voltage conversion circuit 330 includes an nMOS transistor 331. A power supply voltage VDDL lower than the power supply voltage VDDH is applied to the gate of the nMOS transistor 331. The drain and the source of the nMOS transistor 331 are connected to the differential amplification circuit 320 and the positive feedback circuit 340.

The positive feedback circuit 340 includes pMOS transistors 341, 342, and 344 and nMOS transistors 343 and 345. The pMOS transistors 341 and 342 and the nMOS transistor 343 are connected in series to the power supply voltage VDDL. Further, the pMOS transistor 344 and the nMOS transistor 345 are connected in series to the power supply voltage VDDL.

The initialization signal INI from the vertical drive circuit 213 is input to the gates of the pMOS transistor 341 and the nMOS transistor 343. The gate of the pMOS transistor 342 is connected to the connection point of the pMOS transistor 344 and the nMOS transistor 345. Further, the gates of the pMOS transistor 344 and the nMOS transistor 345 are both connected to the voltage conversion circuit 330 and a connection point of the pMOS transistor 342 and the nMOS transistor 343. The potential at the connection point of the pMOS transistor 344 and the nMOS transistor 345 is output to the data storage unit 350 as a comparison result VCO.

Note that each of the voltage conversion circuit 330 and the positive feedback circuit 340 is not limited to the circuit depicted in FIG. 10 as long as each of the circuits has the function described in FIG. 5.

As described above, according to the first embodiment of the present technology, thermal noise can be suppressed compared with the case of using the MOSFET due to use of the TFETs 323 and 324 as the differential pair for amplifying the difference between the pixel signal SIG and the reference signal REF. As a result, noise including a thermal noise component can be reduced.

2. Second Embodiment

In the above-described first embodiment, since the ADC 300 is arranged for each pixel, there is a problem that the number of the ADCs 300 increases as the number of pixels increases, and the circuit scale of the pixel array unit 220 increases. The solid-state imaging element 200 according to a second embodiment is different from the first embodiment in that ADCs are arranged for each column.

Figure 11:
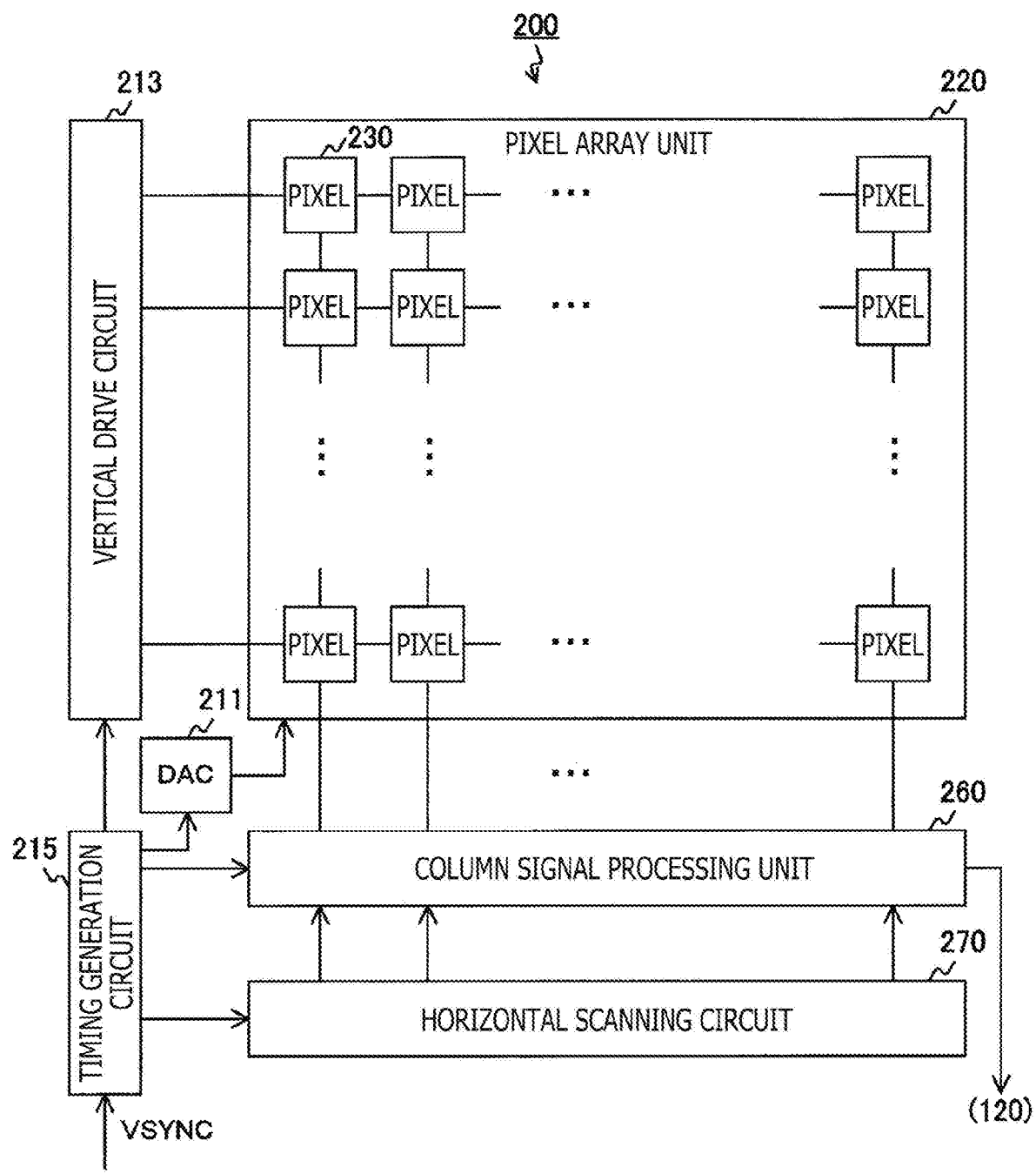
FIG. 11 is a block diagram depicting a configuration example of a solid-state imaging element according to a second embodiment of the present technology.

FIG. 11 is a block diagram depicting a configuration example of the solid-state imaging element 200 according to the second embodiment of the present technology. The solid-state imaging element 200 includes the DAC 211, the vertical drive circuit 213, the timing generation circuit 215, the pixel array unit 220, a column signal processing unit 260, and a horizontal scanning circuit 270. In the pixel array unit 220, the plurality of pixels 230 is arranged in a two-dimensional lattice shape.

The vertical drive circuit 213 according to the second embodiment selects and drives the rows in order. The configurations of the DAC 211 and the timing generation circuit 215 of the second embodiment are similar to those of the first embodiment.

The pixel 230 according to the second embodiment supplies the differential amplification signal HVO to the column signal processing unit 260.

The column signal processing unit 260 applies AD (Analog to Digital) conversion to the differential amplification signal HVO from each of the columns and stores the converted data as pixel data. The horizontal scanning circuit 270 selects columns in order and outputs pixel data of the column to the digital signal processor 120.

Figure 12:
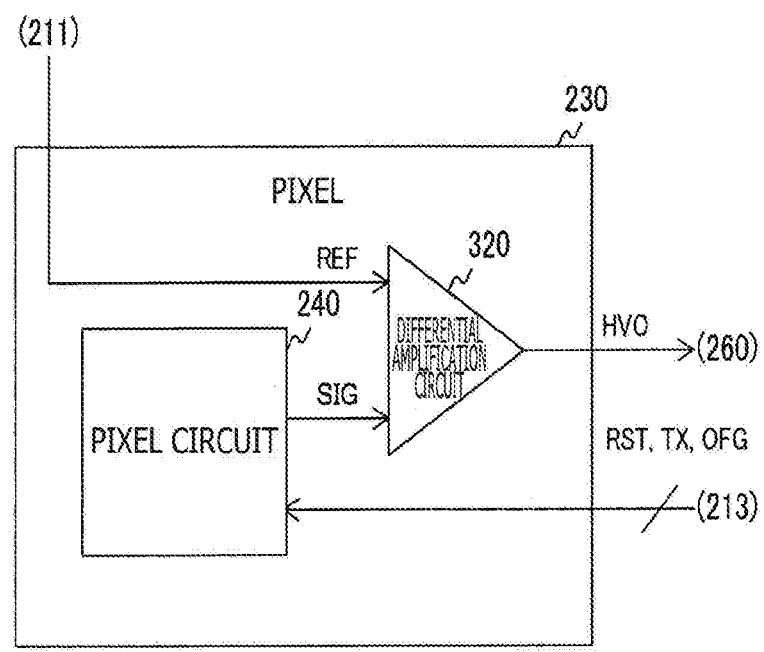
FIG. 12 is a block diagram depicting a configuration example of a pixel according to the second embodiment of the present technology.

FIG. 12 is a block diagram depicting a configuration example of a pixel 230 according to the second embodiment of the present technology. The pixel 230 according to the second embodiment includes the pixel circuit 240 and the differential amplification circuit 320.

The pixel circuit 240 according to the second embodiment generates a pixel signal SIG under the control of the vertical drive circuit 213 and supplies the pixel signal SIG to the differential amplification circuit 320. The differential amplification circuit 320 according to the second embodiment amplifies the difference between the pixel signal SIG and the reference signal REF and supplies the amplified difference to the column signal processing unit 260 as a differential amplification signal HVO.

Figure 13:
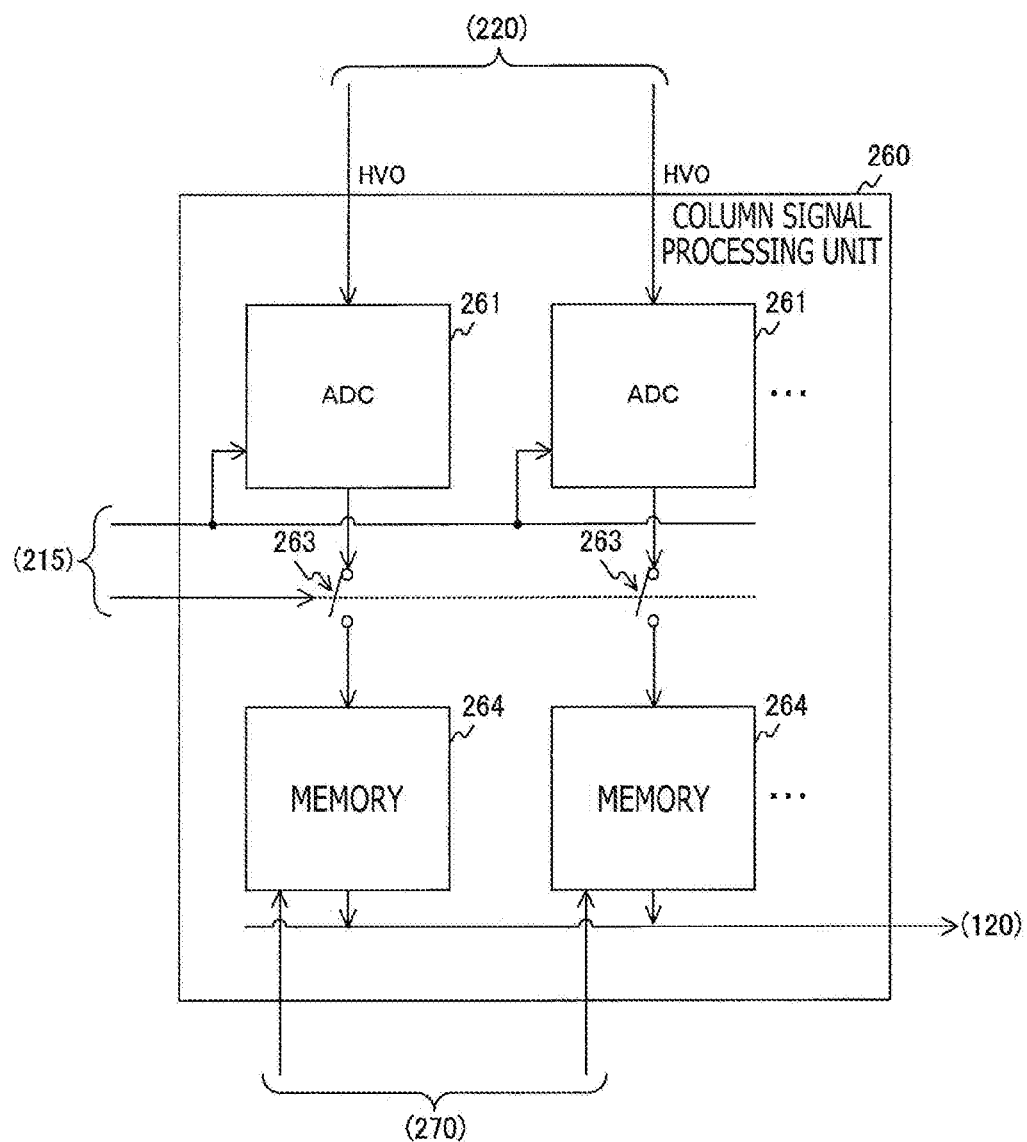
FIG. 13 is a block diagram depicting a configuration example of a column signal processing unit according to the second embodiment of the present technology.

FIG. 13 is a block diagram depicting a configuration example of the column signal processing unit 260 according to the second embodiment of the present technology. The column signal processing unit 260 includes an ADC 261, a switch 263, and a memory 264 for each column.

The ADC 261 converts the differential amplification signal HVO from the corresponding column into digital pixel data under the control of the timing generation circuit 215. The switch 263 causes the memory 264 to store the pixel data from the ADC 261 under the control of the timing generation circuit 215.

The memory 264 stores pixel data. The memory 264 outputs pixel data to the digital signal processor 120 under the control of the horizontal scanning circuit 270. Incidentally, the memory 264 is an example of a data storage unit described in the claims.

Figure 14:
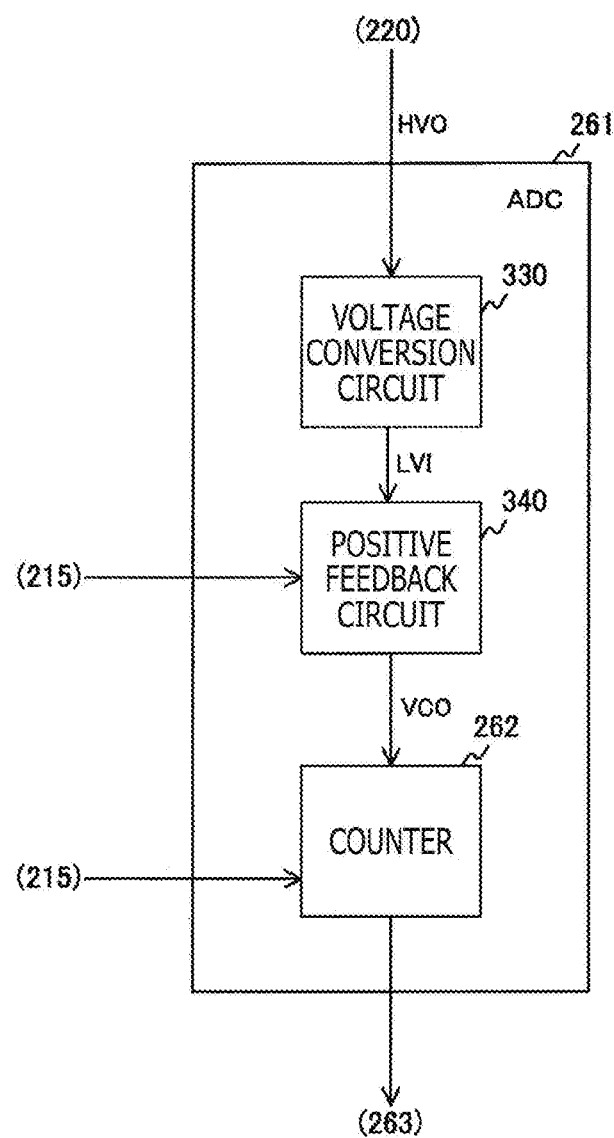
FIG. 14 is a block diagram depicting a configuration example of an ADC according to the second embodiment of the present technology.

FIG. 14 is a block diagram depicting a configuration example of the ADC 261 according to the second embodiment of the present technology. The ADC 261 includes the voltage conversion circuit 330, the positive feedback circuit 340, and a counter 262. The configurations of the voltage conversion circuit 330 and the positive feedback circuit 340 according to the second embodiment are similar to those of the first embodiment. The positive feedback circuit 340 supplies the comparison result VCO to the counter 262.

The counter 262 counts a count value in synchronization with the clock signal from the timing generation circuit 215 over a period of time until the comparison result VCO is inverted, under the control of the timing generation circuit 215. This count value indicates the time until the comparison result VCO is inverted. The counter 262 supplies data indicating the count value to the switch 263 as pixel data.

As described above, in the second embodiment of the present technology, since the ADC 261 is arranged for each column, the circuit scale of the pixel array unit 220 can be reduced as compared with the first embodiment in which the ADC is arranged for each pixel.

3. Example of Application to Mobile Body

The technology according to the present disclosure (the present technology) can be applied to various products. For example, the technology according to the present disclosure may be accomplished as a device mounted on any type of mobile body such as an automobile, an electric vehicle, a hybrid electric vehicle, a motorcycle, a bicycle, a personal mobility, an airplane, a drone, a ship, and a robot.

Figure 15:
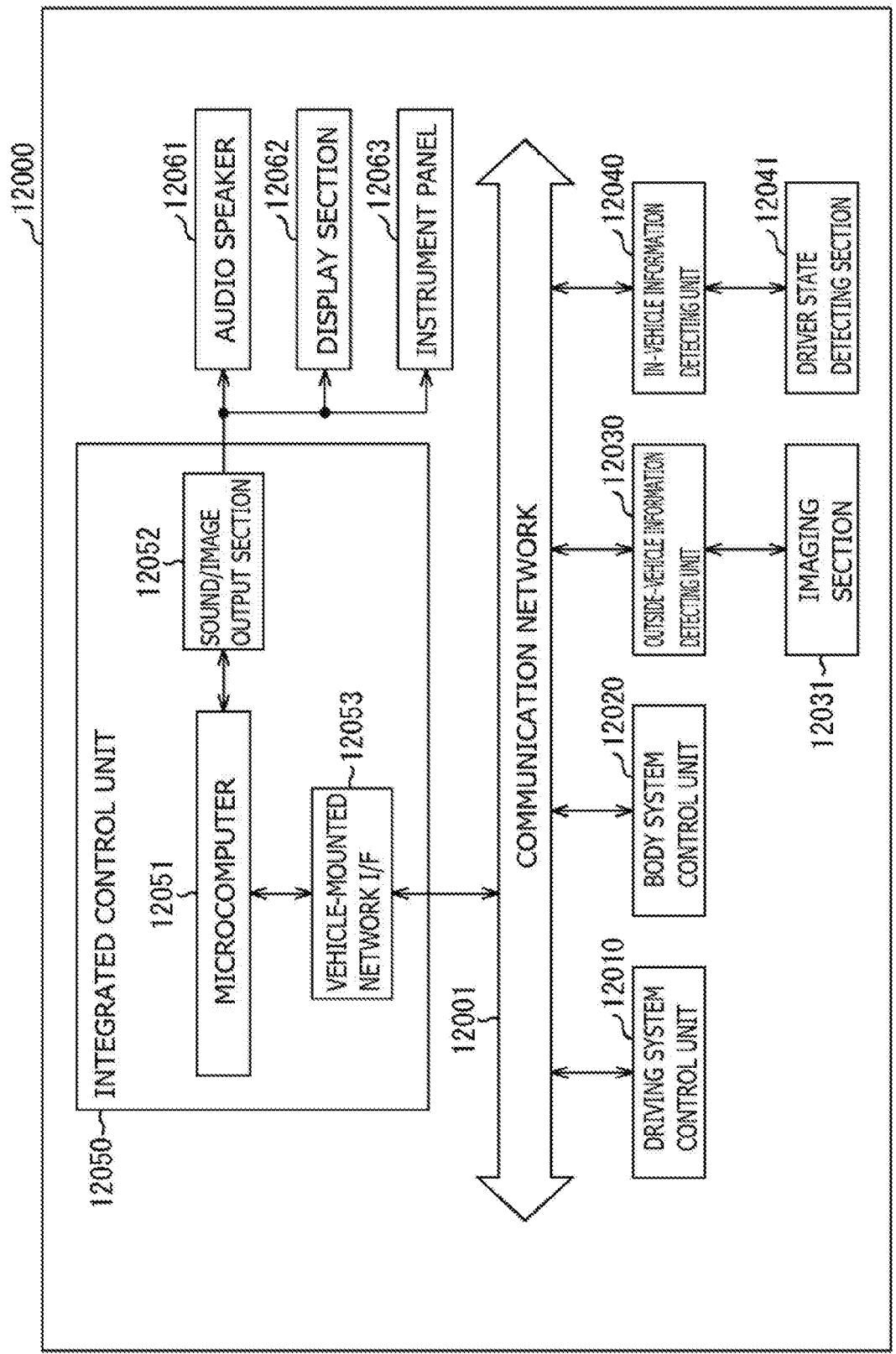
FIG. 15 is a block diagram depicting an example of a schematic configuration of a vehicle control system.

FIG. 15 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 15, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 15, an audio speaker 12061, a display section 12062, and an instrument panel 12063 are illustrated as the output device. The display section 12062 may, for example, include at least one of an on-board display and a head-up display.

Figure 16:
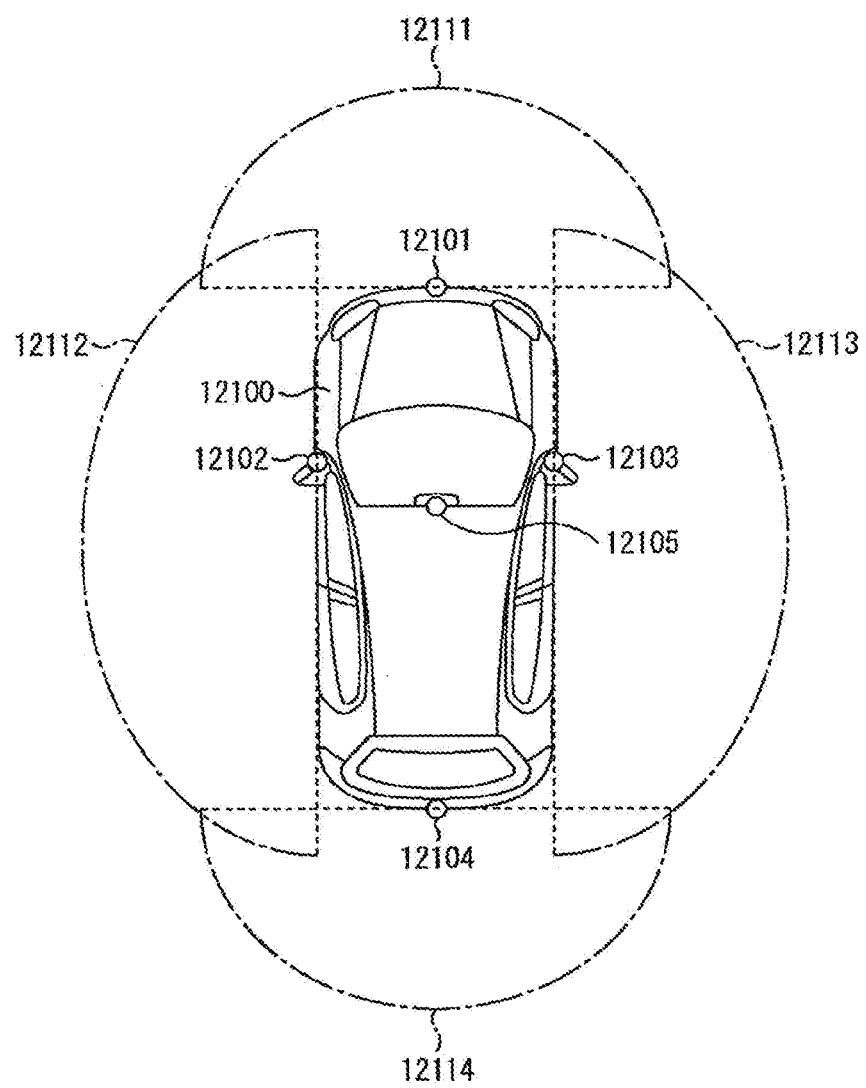
FIG. 16 is an explanatory diagram depicting an example of an installation position of an imaging section.

FIG. 16 is a diagram depicting an example of the installation position of the imaging section 12031.

In FIG. 16, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 16 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

As described above, an example of the vehicle control system to which the technology according to the present disclosure can be applied has been described. The technology according to the present disclosure can be applied to the imaging section 12031 in the configuration described above. To be specific, the imaging device 100 in FIG. 1 can be applied to the imaging section 12031. By applying the technology according to the present disclosure to the imaging section 12031, thermal noise can be reduced and a more easily viewable captured image can be obtained, so that driver fatigue can be reduced.

Note that the above-described embodiment is an example for embodying the present technology, and the matters in the embodiment and the matters specifying the invention in the claims have a corresponding relationship. Similarly, the matters specifying the invention in the claims and the matters to which the same names are assigned in the embodiments of the present technology have a corresponding relationship. However, the present technology is not limited to the embodiments, and can be embodied by applying various modifications to the embodiments without departing from the gist thereof.

It should be noted that the effects described in the present specification are merely examples, the effects of the present technology are not limited thereto, and may include other effects.

Note that the present technology may have the following configurations.

(1)

A semiconductor integrated circuit including:

a pixel circuit that photoelectrically converts incident light to generate a pixel signal; and a pair of TFETs (Tunnel Field Effect Transistors) for amplifying the difference between the pixel signal and a predetermined reference signal that changes with time and outputting the amplified difference as a differential amplification signal.

(2)

The semiconductor integrated circuit described in the item (1), further including:

a MOSFET (Metal Oxide Semiconductor Field Effect Transistor) for supplying a constant current to the pair of TFETs, in which the gate area of the MOSFET is substantially equal to the gate area of each of the pair of TFETs.

(3)

The semiconductor integrated circuit described in the item (1) or (2), in which a predetermined number of the pixel circuits are arranged in a two-dimensional lattice shape, and the pair of TFETs is provided for each of the pixel circuits.

(4)

The semiconductor integrated circuit described in the item (1), further including:

a data storage unit that acquires and stores data indicating time until the differential amplification signal changes to have a value different from an initial value, as pixel data.

(5)

The semiconductor integrated circuit described in the item (4), in which the data storage unit is provided for each of the pixel circuits.

(6)

The semiconductor integrated circuit described in the item (4), in which the storage unit is provided for each column that includes a set of the pixel circuits arranged in a predetermined direction.

(7)

The semiconductor integrated circuit described in any one of the items (1) to (6), further including:

a substrate;

an N-well layer formed on the substrate;

a pair of N layers including an N-type semiconductor; and a P layer including a P-type semiconductor, in which the P layer and the pair of N layers are provided on the N-well layer, the P layer is disposed between the pair of N layers on the N-well layer, each source of the pair of TFETs is formed in the P layer, and drains of the pair of TFETs are formed in the pair of N layers, respectively.

(8)

An imaging device including:

a pixel circuit that photoelectrically converts incident light to generate a pixel signal;

a pair of TFETs (Tunnel Field Effect Transistor) for amplifying the difference between the pixel signal and a predetermined reference signal that changes with time and outputting the amplified difference as a differential amplification signal;

a data storage unit that acquires and stores data indicating time until the differential amplification signal changes to have a value different from an initial value, as pixel data; and a processing unit that performs a predetermined processing on the pixel data.

REFERENCE SIGNS LIST

100 Imaging device
110 Optical unit
120 Digital signal processor
130 Display unit
140 Operation unit
150 Bus
160 Frame memory
170 Recording unit
180 Power supply unit
200 Solid-state imaging element
201 Pixel chip
202 Logic chip
211 DAC
212 Time code generation unit
213 Vertical drive circuit
214 Pixel drive circuit
215 Timing generation circuit
220 Pixel array unit
221 Time code transfer section 230 Pixel
240 Pixel circuit
241 Reset transistor
242 Transfer transistor
243 Floating diffusion layer
244 Photodiode
245 Discharge transistor
250 Output unit
260 Column signal processing unit
261, 300 ADC
262 Counter
263 Switch
264 Memory
270 Horizontal scanning circuit
310 Comparison circuit
320 Differential amplification circuit
321, 322, 325 MOSFET
323, 324 TFET
330 Voltage conversion circuit
331, 343, 345 nMOS transistor
340 Positive feedback circuit
341, 342, 344 pMOS transistor
350 Data storage unit
351 Latch control section
352 Latch storage section
12031 Imaging section

The invention claimed is:

1. A semiconductor integrated circuit, comprising:
a pixel circuit configured to photoelectrically convert incident light to a pixel signal;
a pair of TFETs (Tunnel Field Effect Transistors) that includes a first TFET and a second TFET, wherein the pair of TFETs is configured to:
amplify a difference between the pixel signal and a reference signal, wherein the reference signal changes with time; and
output the amplified difference as a differential amplification signal; and
a MOSFET (Metal Oxide Semiconductor Field Effect Transistor) configured to supply a constant current to the pair of TFETs, wherein
a source of the first TFET and a source of the second TFET are connected to a drain of the MOSFET, and
a first area of a gate of the MOSFET is substantially equal to each of a second area of a gate of the first TFET and a third area of a gate of the second TFET.

2. The semiconductor integrated circuit according to claim 1, further comprising
a plurality of pixel circuits in a two-dimensional lattice shape, wherein
the plurality of pixel circuits includes the pixel circuit, and
a respective pair of TFETs is for each pixel circuit of the plurality of pixel circuits.

3. The semiconductor integrated circuit according to claim 2, further comprising
a data storage unit configured to acquire and store data, that indicates time until the differential amplification signal changes to a value different from an initial value, as pixel data.

4. The semiconductor integrated circuit according to claim 3, further comprising a plurality of data storage units, wherein
the plurality of data storage units includes the data storage unit, and
a respective data storage unit of the plurality of data storage units is for each pixel circuit of the plurality of pixel circuits.

5. The semiconductor integrated circuit according to claim 3, wherein the data storage unit is for each column that includes a set of pixel circuits, of the plurality of pixel circuits, in a specific direction.

6. The semiconductor integrated circuit according to claim 1, further comprising:
a substrate;
an N-well layer on the substrate;
a pair of N layers including an N-type semiconductor; and
a P layer including a P-type semiconductor, wherein
the P layer and the pair of N layers are on the N-well layer,
the P layer is between the pair of N layers on the N-well layer,
each source of the pair of TFETs is in the P layer, and
each drain of the pair of TFETs is in the pair of N layers.

7. An imaging device, comprising:
a pixel circuit configured to photoelectrically convert incident light to a pixel signal;
a pair of TFETs (Tunnel Field Effect Transistors) that includes a first TFET and a second TFET, wherein the pair of TFETs is configured to:
amplify a difference between the pixel signal and a reference signal, wherein the reference signal changes with time; and
output the amplified difference as a differential amplification signal;
a MOSFET (Metal Oxide Semiconductor Field Effect Transistor) configured to supply a constant current to the pair of TFETs, wherein
a source of the first TFET and a source of the second TFET are connected to a drain of the MOSFET, and
a first area of a gate of the MOSFET is substantially equal to each of a second area of a gate of the first TFET and a third area of a gate of the second TFET;
a data storage unit configured to acquire and store time information, that indicates time until the differential amplification signal changes to a value different from an initial value, as pixel data; and
a processing unit configured to perform a specific processing on the pixel data.

* * * * *